United States Patent
Wang et al.

(10) Patent No.: US 10,888,017 B2
(45) Date of Patent: Jan. 5, 2021

(54) DISPLAY MODULE AND ELECTRICAL EQUIPMENT

(71) Applicant: BOE TECHNOLOGY GROUP CO., LTD., Beijing (CN)

(72) Inventors: Zifeng Wang, Beijing (CN); Yan Ren, Beijing (CN); Lei Cao, Beijing (CN); Junmin Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/445,670

(22) Filed: Jun. 19, 2019

(65) Prior Publication Data

US 2020/0060041 A1 Feb. 20, 2020

(30) Foreign Application Priority Data

Aug. 15, 2018 (CN) .................... 2018 2 1315589 U

(51) Int. Cl.
| H05K 7/00 | (2006.01) |
| H05K 7/20 | (2006.01) |
| H05K 5/00 | (2006.01) |
| G09F 9/30 | (2006.01) |

(52) U.S. Cl.
CPC ............. H05K 7/20 (2013.01); G09F 9/30 (2013.01); H05K 5/0017 (2013.01)

(58) Field of Classification Search
None
See application file for complete search history.

(56) References Cited

U.S. PATENT DOCUMENTS

| 10,281,645 | B2* | 5/2019 | Kong ................... G02B 6/0056 |
| 10,331,171 | B2* | 6/2019 | Seino ................... G06F 1/1656 |
| 10,345,512 | B2* | 7/2019 | Jeon ...................... G02B 6/0088 |
| 10,558,068 | B2* | 2/2020 | Ohtsubo ........... G02F 1/133606 |
| 2006/0061256 | A1* | 3/2006 | Oroku ................... H01J 29/864 |
| | | | 313/496 |
| 2007/0165152 | A1* | 7/2007 | Suzuki .............. G02F 1/133308 |
| | | | 349/58 |
| 2011/0226335 | A1* | 9/2011 | Naitoh .................... H02S 20/00 |
| | | | 136/259 |
| 2011/0285925 | A1* | 11/2011 | Ono ........................ F16M 11/38 |
| | | | 348/836 |
| 2014/0362554 | A1* | 12/2014 | Rikiishi .................. G09F 9/302 |
| | | | 361/809 |
| 2015/0042899 | A1* | 2/2015 | Tomomasa ........ G02F 1/133308 |
| | | | 348/790 |
| 2015/0225275 | A1* | 8/2015 | Tomisaka ................ C03B 11/14 |
| | | | 65/61 |
| 2015/0277179 | A1* | 10/2015 | Nishi ................... G02B 6/0088 |
| | | | 349/58 |
| 2016/0274297 | A1* | 9/2016 | Ikuta ..................... G02B 6/0091 |
| 2016/0282549 | A1* | 9/2016 | Masuda ................. G02B 6/005 |
| 2019/0086959 | A1* | 3/2019 | Seino ..................... G06F 1/1656 |

* cited by examiner

*Primary Examiner* — Courtney L Smith
*Assistant Examiner* — Rashen E Morrison
(74) *Attorney, Agent, or Firm* — Leason Ellis LLP

(57) ABSTRACT

A display module and an electrical equipment. The display module includes a display screen, a packaging structure and a heating layer. The packaging structure includes a packaging frame surrounding an edge of the display screen. The heating layer is between the packaging frame and the display screen.

12 Claims, 6 Drawing Sheets

DISPLAY MODULE AND ELECTRICAL EQUIPMENT

CROSS REFERENCE TO RELATED APPLICATIONS

The present application claims priority to Chinese Patent Application No. 201821315589.4, filed on Aug. 15, 2018, the disclosure of which is incorporated herein by reference in its entirety as part of the present application.

TECHNICAL FIELD

The embodiments of the disclosure relate to a display module and an electrical equipment.

BACKGROUND

A transparent display module is obtained by encapsulating a display screen between two glass panels. The transparent display module is commonly used as a display structure of an electrical equipment for displaying articles or structures inside the electrical equipment.

SUMMARY

At least an embodiment of the present disclosure provides a display module including: a display screen; a packaging structure including a packaging frame surrounding an edge of the display screen; and a heating layer is between the packaging frame and the display screen.

For example, the display module according to at least an embodiment of the present disclosure further includes a light emitting component configured to be on the packaging frame and used as a light source for the display screen, wherein the light emitting component is connected with the heating layer.

For example, in the display module according to at least an embodiment of the present disclosure, the packaging structure further includes:

a panel, wherein the panel is on opposite surfaces of the display screen, and the packaging frame surrounds an edge of a display body formed by the panel and the display screen;

a first buffer sealing layer between the display screen and the panel; and a second buffer sealing layer between the panel and the packaging frame, the second buffer sealing layer surrounding the edge of the display body.

For example, in the display module according to at least an embodiment of the present disclosure, the heating layer is at a corner of the packaging frame; or the heating layer is arranged along an entire circumference of the packaging frame.

For example, in the display module according to at least an embodiment of the present disclosure, the heating layer and the second buffer sealing layer are identical in shape, and the heating layer is between the second buffer sealing layer and the packaging frame and surrounds the second buffer sealing layer; or the heating layer is between the second buffer sealing layer and the display body and surrounds the edge of the display body.

For example, in the display module according to at least an embodiment of the present disclosure, the heating layer is a strip-shaped sheet, and the heating layer is between the second buffer sealing layer and the packaging frame and surrounds the second buffer sealing layer on a side of the display body;

the heating layer is between the second buffer sealing layer and the display body and surrounds a side of the display body;

the heating layer is attached with the first buffer sealing layer and is between the first buffer sealing layer and the display screen; or the heating layer is attached with the first buffer sealing layer and is between the first buffer sealing layer and the panel.

For example, in the display module according to at least an embodiment of the present disclosure, the heating layer is a metal mesh layer; or the heating layer is a metal sheet layer.

For example, in the display module according to at least an embodiment of the present disclosure, an electrical connection terminal of the light emitting component is connected to the heating layer through a preset electrical connection path.

For example, in the display module according to at least an embodiment of the present disclosure, the packaging frame includes a first side frame, a second side frame, a third side frame, and a fourth side frame, the first side frame and the second side frame are on two opposite sides of the display screen, the light emitting component is on at least one of the first side frame and the second side frame, and the third side frame and the fourth side frame are on another two opposite sides of the display screen, a locking clearance cavity of the third side frame is in communication with locking clearance cavities of the first side frame and the second side frame, and a locking clearance cavity of the fourth side frame is in communication with the locking clearance cavities of the first side frame and the second side frame, and the locking clearance cavity of the third side frame is blocked at a preset distance from the first side frame and at a preset distance from the second side frame, and the locking clearance cavity of the fourth side frame is blocked at a preset distance from the first side frame and at a preset distance from the second side frame.

For example, in the display module according to at least an embodiment of the present disclosure, the display screen is at least partially transparent.

For example, in the display module according to at least an embodiment of the present disclosure, the packaging frame entirely surrounds the edge of the display screen.

For example, in the display module according to at least an embodiment of the present disclosure, the panel is at least partially transparent.

For example, in the display module according to at least an embodiment of the present disclosure, the packaging frame and the second buffer sealing layer both entirely surround the edge of the display body.

For example, in the display module according to at least an embodiment of the present disclosure, the first buffer sealing layer entirely surrounds the edge of the display screen on a surface of the display screen facing the panel.

For example, in the display module according to at least an embodiment of the present disclosure, a cross-section of the second buffer sealing layer is of a "C" shaped.

At least an embodiment of the present disclosure further provides an electrical equipment, which may include any of the display modules described above.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

Figure 1:
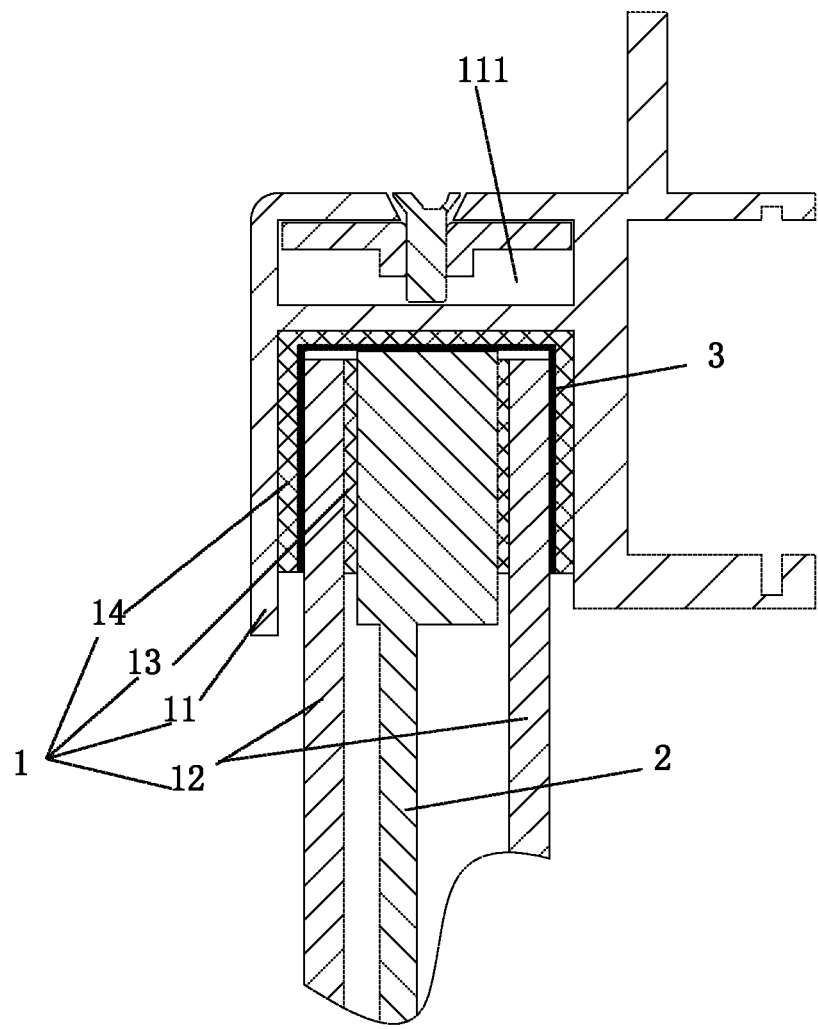
FIG. 1 is a schematic cross-sectional structural diagram of a transparent display module according to at least an embodiment of the present disclosure taken at a first viewing angle.

In order to make objects, technical solutions and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

It should be understood that in the present disclosure, the term "wrap" may have the same or similar meaning as the term "surround" and the two terms may be used interchangeably.

In addition, it should be understood that in this disclosure, the term "end" may have the same or similar meaning as the term "edge" and the two terms may be used interchangeably.

When the transparent display module is used on some electrical equipment in which there is a difference between the internal and the external temperatures, for example, when the transparent display module is used on an instant juice retailer, the internal space of the equipment requires to be refrigerated because fruits in the equipment requires to be kept fresh, so that the two surfaces of the transparent display module are at different temperatures, and the transparent display module may not be completely sealed at the sealing edges, especially at the joint of the two sealing edges, cold air may enter the transparent display module from gaps. When cold air meets normal-temperature air inside the transparent display module, condensed water will appear inside the module near the gap, thus affecting the display effect of the transparent display module.

At least an embodiment of the present disclosure provides a display module and an electrical equipment, which may eliminate the condensation phenomenon, thereby improving the display effect of the display module.

The display module according to at least an embodiment of the present disclosure may include:

a display screen;

a packaging structure, including a packaging frame surrounding an edge of the display screen; and a heating layer, arranged between the packaging frame and the display screen.

Figure 2:
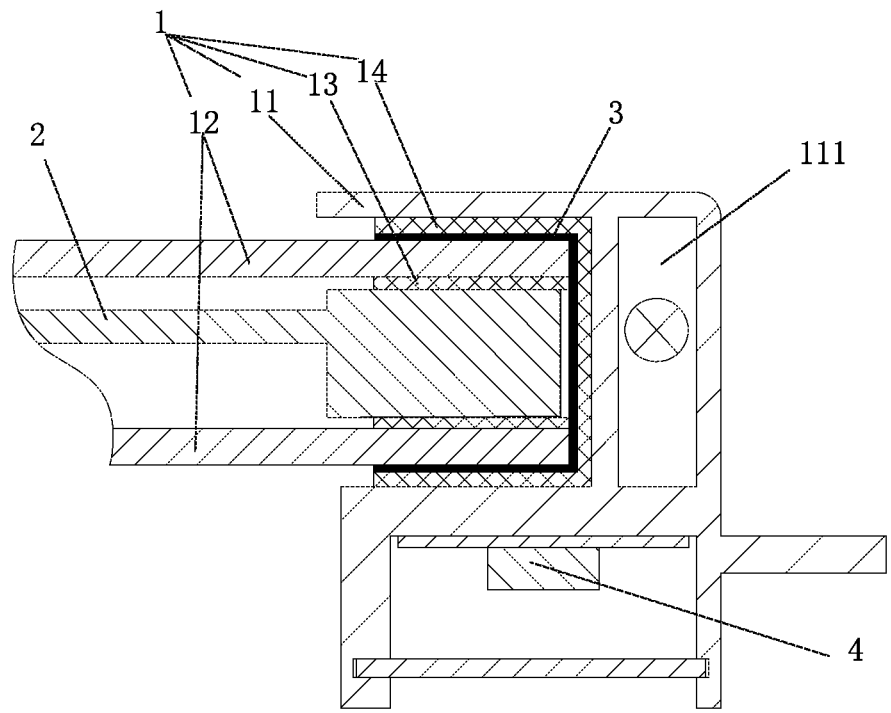
FIG. 2 is a schematic cross-sectional structural diagram of a transparent display module according to at least an embodiment of the present disclosure taken at a second viewing angle.

As shown in FIG. 1 and FIG. 2, a transparent display module according to at least an embodiment of the present disclosure includes: a transparent display screen 2, a packaging structure 1, and a heating layer. The transparent display screen 2 is packaged by the packaging structure 1. The packaging structure 1 comprises a packaging frame 11 wrapping the entire circumference of the end of the transparent display screen 2, and the packaging frame 11 is provided with a light emitting component 4 which is used as a light source of the transparent display screen 2. The heating layer 3 is disposed between the packaging frame 11 and the transparent display screen 2, and connected to the electrical connection terminal of the light emitting component 4. The packaging structure 1 further comprises transparent panels 12, a first buffer sealing layer 13 and a second buffer sealing layer 14. The transparent panels 12 are arranged on two opposite surfaces of the transparent display screen 2, and the packaging frame 11 wraps the entire circumference of the transparent display body formed by the transparent panels 12 and the transparent display screen 2. The first buffer sealing layer 13 is disposed at the entire circumference of the edge of the transparent display screen 2 between the transparent display screen 2 and the transparent panel 12. The second buffer sealing layer 14 is disposed between the transparent panel 12 and the packaging frame 11, and wraps the entire circumference of the end of the transparent display body and the entire circumference of the edge of the transparent panel 12.

In other embodiments, the packaging structure 1 may be configured to surround at least a portion of the edge of the transparent display screen 2, while the remaining portion of the edge of the transparent display screen 2 may be, for example, hermetically connected with other elements, and the embodiments of the present disclosure are not limited thereto. Similarly, the packaging frame 11 may be configured to surround at least a portion of the edge of the transparent display body, the first buffer sealing layer 13 may be configured to surround at least a portion of the edge of the transparent display screen 2 between the transparent display screen 2 and the transparent panel 12, and the second buffer sealing layer 14 may be configured to surround at least a portion of the edge of the transparent display body, and the embodiments of the present disclosure are not limited thereto. For example, in some embodiments, both the packaging frame and the second buffer sealing layer may surround the entire edge of the display body, and the first buffer sealing layer may surround the entire edge of the display screen on the surface of the display screen facing the panel.

It should be understood that the display module and the display screen provided by the embodiment of the present disclosure may be at least partially transparent. The transparent display module and the transparent display screen 2 described above are only examples of the display module and the display screen provided in the embodiment of the present disclosure, and the embodiments of the present disclosure are not limited thereto. In addition, it should be understood that the transparent panel 12 described above is only exemplary. In other embodiments of the present disclosure, the packaging structure may include at least partially transparent panels, and the embodiments of the present disclosure are not limited thereto.

Although the light emitting component 4 is provided on the packaging frame 11 in the above embodiment, it should be understood that the embodiments of the present disclosure are not limited thereto. The light emitting component 4 may also be separately provided and not included in the display module.

Specifically, the transparent display screen 2 may not only display images on the surface of the screen, but also allow the product behind the transparent display screen 2 to be seen through the transparent display screen 2. The transparent display screen 2 may further render the displayed product, enhance the publicity effect, and may also be used to specifically introduce the product. The production process of transparent display screen 2 may be any suitable process, and the size, shape, etc. of the transparent display screen 2 may be selected according to specific requirements and obtained through procurement, or the transparent display screen 2 may be self-produced. The specific structure and working principle of the transparent display screen 2 are known to those skilled in the art and will not be described here. The packaging structure 1 is a structure used for packaging the transparent display screen 2 to protect the transparent display screen 2 from dust pollution and collision of objects, and it is required that the packaged transparent display screen 2 is still transparent and images, characters and other display information on the transparent display screen can be seen, so the transparent panel 12 may be made of transparent materials such as toughened glass, common glass or acrylic. The transparent panels 12 may be of the same size as the transparent display screen 2, and are arranged on opposite surfaces of the transparent display screen 2. Finally, the transparent panels 12 are encapsulated by the encapsulation frame 11, which may encapsulate at the side the entire circumference of the end of the transparent display body formed by the transparent panel 12 and the transparent display screen 2. The encapsulation frame 11 may adopt any suitable profile, such as a strip aluminum profile with a catching groove. The first buffer sealing layer 13 and the second buffer sealing layer 14 may be made of the same material and have certain elasticity, such as foam cotton material or rubber material, and the compositions of the materials of the first buffer sealing layer 13 and the second buffer sealing layer 14 may be different under the condition of ensuring the functions thereof. It should be noted that the first buffer sealing layer 13 is located between the transparent display screen 2 and the transparent panel 12 and at the entire circumferences of the coupled edges of the transparent display screen 2 and the transparent panel 12, while the second buffer sealing layer 14 is also located at the side at the entire circumferences of the ends of the transparent display screen 2 and the transparent panel 12 and may also wrap at the side the entire circumference of the edge of the transparent panel 2 to ensure a good sealing effect. The first buffer sealing layer 13 and the second buffer sealing layer 14 may be disposed by adhesives or by pressing. The light emitting component 4 may be arranged on the packaging frame 11 on opposite sides of the transparent display screen 2, the light emitting component 4 may be a LED light strip, and the power of the light emitting component 4 or the number of LEDs in the LED light strip may be set according to specific use requirements. The heating layer 3 may be any metal component capable of generating heat when electrified, but the heat emitted by the heating layer 3 may not be too high to avoid causing expansion cracks at the packaging position, so the heating layer 3 is connected with the electrical connection terminal of the light emitting component 4, and a part of the power of the light emitting component 4 is distributed to the heating layer 3, thereby ensuring that the heating layer 3 is not overheated; in addition, the heating layer 3 may be disposed at a position in the packaging structure 1 which is prone to a gap, that is, between the packaging frame 11 and the transparent display screen 2. In other embodiments, the heating layer 3 may also be a heat conducting layer configured to conduct heat generated by the light emitting assembly 4, i.e., the heating layer 3 may receive heat generated by the light emitting assembly 4 without generating heat itself, and the embodiments of the present disclosure are not limited thereto.

The transparent display module provided by the present disclosure may be directly arranged on an electric appliance for displaying internal products and used as a display window of the electric appliance, for example, is arranged on an instant juice retailer and an automatic vending machine.

In the technical solution disclosed by the present disclosure, a heating layer is additionally arranged in the transparent display module, the heating layer is connected with the electrical connection terminal of the light emitting component, and thus the heating layer may be electrified and heated at the same time when the light emitting component is electrified. The heating layer is arranged between the packaging frame and the transparent display screen to heat the gas near the heating layer to a certain temperature, in particular, the air entering between the transparent display screen and the packaging structure through the gap of the packaging structure, thereby effectively solving the problem that the low-temperature air entering between the transparent display screen and the packaging structure which meets the air with a higher temperature causes condensation and thus affects the display effect of the transparent display module, and ensuring that when the transparent display module is used as a display device of an electrical equipment requiring refrigeration, the condensation of water vapor does not occur in the transparent display module.

As shown in FIG. 1 and FIG. 2, in a specific implementation, the heating layer 3 may be disposed at a position in the packaging structure 1 which is prone to a gap, i.e., between the packaging frame 11 and the transparent display screen 2, for example, the heating layer 3 may be disposed at a plurality of corners of the packaging frame 11. Or, the heating layer 3 is provided at positions corresponding to the packaging frame 11 located at the entire circumference of the transparent display screen 2. In some embodiments, the heating layer 3 may be provided along the entire circumference of the packaging frame 11.

Specifically, the arrangement of the first buffer sealing layer 13 and the second buffer sealing layer 14 may generally ensure the sealing effect, but the bending joint of the packaging frame 11 is usually the joint of two parts of the packaging frame 11, and an open gap often occurs, so the packaging structure 1 and the transparent display screen 2 are prone to having a gap at this position, i.e. the air with water vapor of a lower temperature is easy to enter at this position, so the heating layer 3 may be correspondingly arranged at the bending part of the corner of the packaging frame 11. In addition, in order to be on the safe side, the heating layer 3 may also be arranged corresponding to the entire circumference of the transparent display screen 2, that is, the entire circumference where the packaging structure 1 and the transparent display screen 2 are matched, so that there is no problem in any position where the packaging structure 1 and the transparent display screen 2 are coupled. Because the heating layer 3 is arranged near the gap, and the cold air may enter between the transparent display screen 2 and the packaging structure 1 through the gap after being heated, thereby avoiding the condensation of water vapor.

Figure 3:
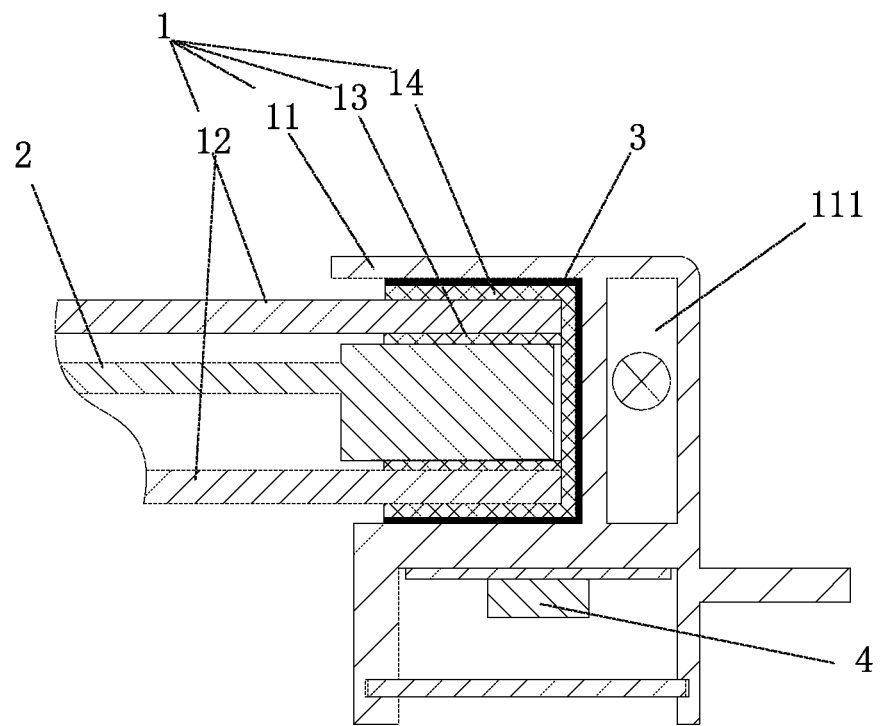
FIG. 3 is a schematic cross-sectional structural diagram of another transparent display module according to at least an embodiment of the present disclosure taken at a second viewing angle.

As shown in FIG. 1, in a specific implementation, the shape of the heating layer 3 is the same as that of the second buffer sealing layer 14. The heating layer 3 is disposed between the second buffer sealing layer 14 and the transparent display body to wrap the end of the transparent display body and the edge of the transparent panel 12. Or, as shown in FIG. 3, the heating layer 3 is disposed between the second buffer sealing layer 14 and the packaging frame 11 to wrap the second buffer sealing layer 14. As shown in FIG. 1, the cross-section of the second buffer sealing layer 14 may be of a "⊏" shape, however, it should be understood that the embodiments of the present disclosure are not limited thereto.

Figure 4:
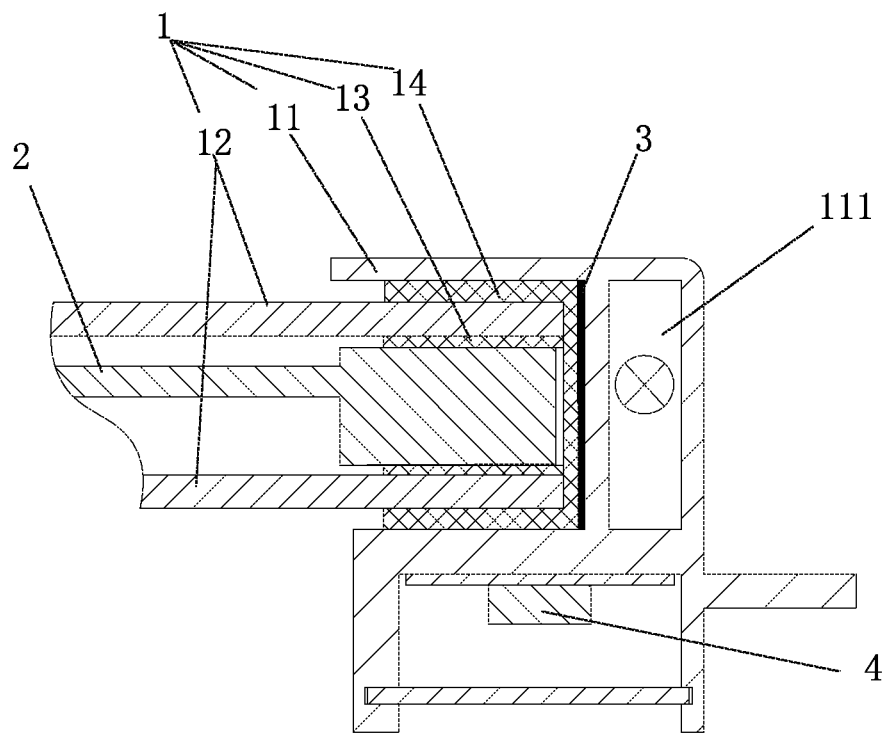
FIG. 4 is a schematic cross-sectional structural diagram of another transparent display module according to at least an embodiment of the present disclosure taken at a second viewing angle.
Figure 5:
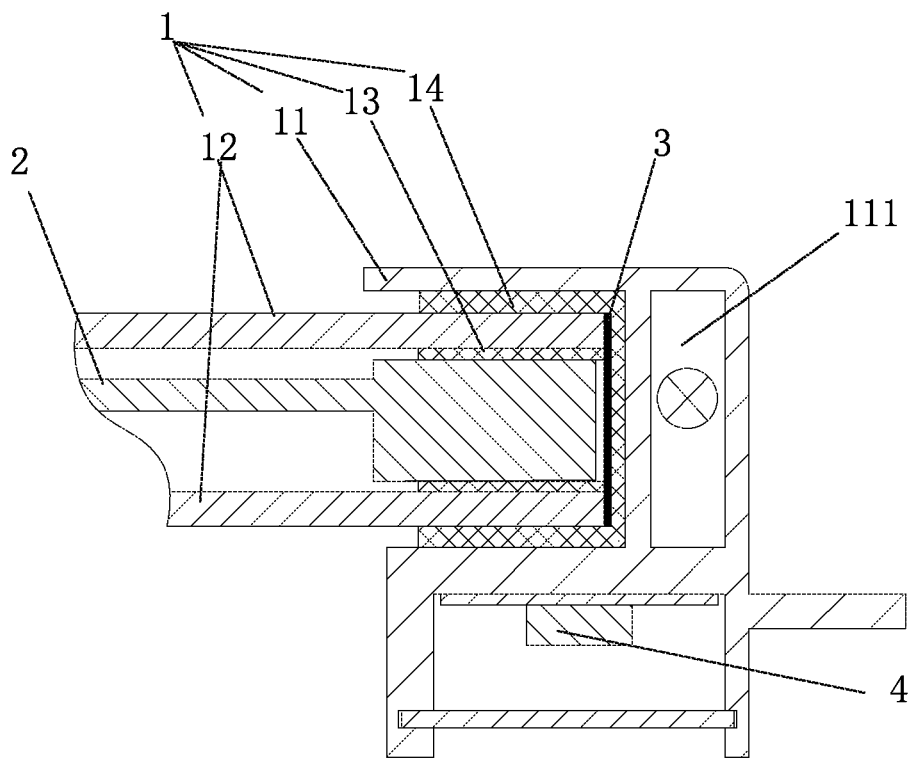
FIG. 5 is a schematic cross-sectional structural diagram of another transparent display module according to at least an embodiment of the present disclosure taken at a second viewing angle.
Figure 6:
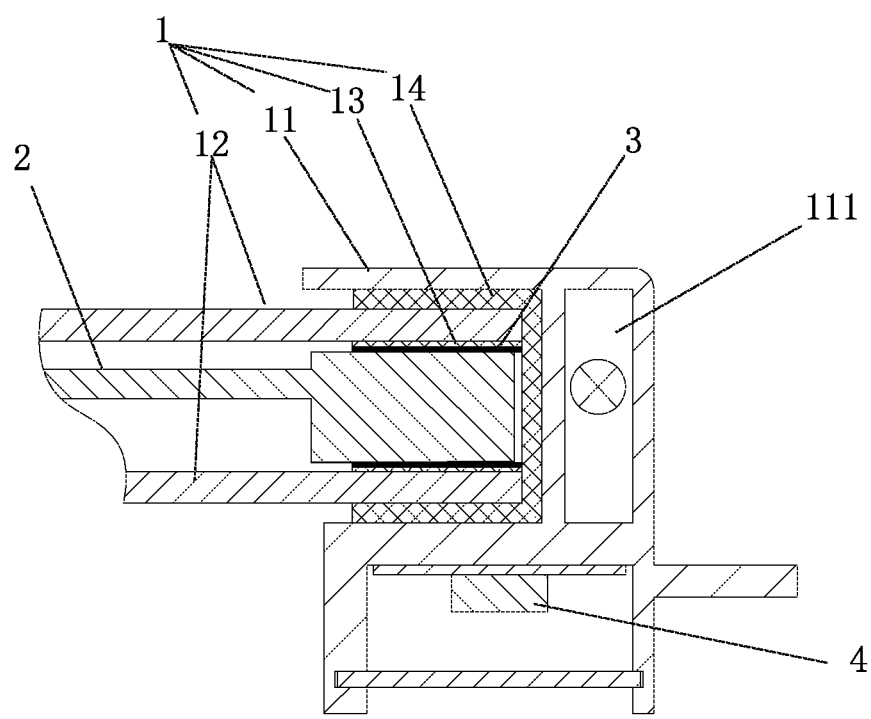
FIG. 6 is a schematic cross-sectional structural diagram of another transparent display module according to at least an embodiment of the present disclosure taken at a second viewing angle.
Figure 7:
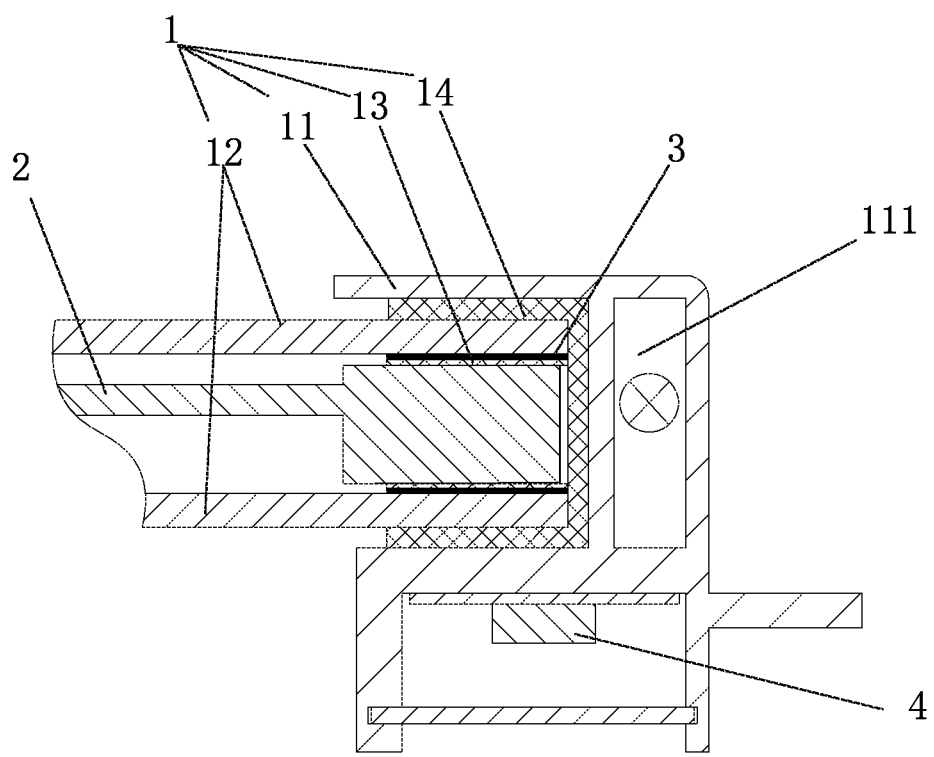
FIG. 7 is a schematic cross-sectional structural diagram of another transparent display module according to at least an embodiment of the present disclosure taken at a second viewing angle.

Alternatively, as shown in FIG. 4 to FIG. 7, the heating layer 3 is a strip-shaped sheet; as shown in FIG. 4, the heating layer 3 is disposed between the second buffer sealing layer 14 and the packaging frame 11 to wrap the second buffer sealing layer 14 at the end of the transparent display body. Or, as shown in FIG. 5, the heating layer 3 is disposed between the second buffer sealing layer 14 and the transparent display body to wrap the end of the transparent display body. Alternatively, as shown in FIG. 6, the heating layer 3 is attached to the first buffer sealing layer 13 and is disposed between the first buffer sealing layer 13 and the transparent display screen 2. Alternatively, as shown in FIG. 7, the heating layer 3 is attached to the first buffer sealing layer 13 and is disposed between the first buffer sealing layer 13 and the transparent panel 12.

Specifically, the heating layer 3 is positioned to be close to the edge of the transparent panel 12 joining the transparent display screen 2 when the transparent panel 12 and the transparent display screen 2 are packaged, thus ensuring that air entering between the transparent panel 12 and the transparent display screen 2 from the joint may be heated by the heating layer 3. In addition, it should be noted that when the heating layer 3 is in contact with the packaging frame 11, the surface of the heating layer 3 requires to be insulated, or the contact surfaces of the heating layer 3 and the packaging frame 11 are insulated.

As shown in FIG. 1 to FIG. 7, in a specific implementation, the heating layer 3 is a metal mesh layer; alternatively, the heating layer 3 is a metal sheet layer.

Specifically, the specific metal materials for manufacturing the metal mesh and the metal sheet may be selected according to the specific use requirements.

In a specific implementation, the electrical connection terminal of the light emitting component is connected with the heating layer through a preset electrical connection path.

Specifically, an electrical connection path may be arranged at the electrical connection terminal of the light emitting component, so that the heating layer may divide part of the power of the light emitting component. The electrical connection path may be preset on the light emitting component, for example, on the main board of the light emitting component. The specific arrangement method is known to those skilled in the art and will not be repeated here.

Figure 8:
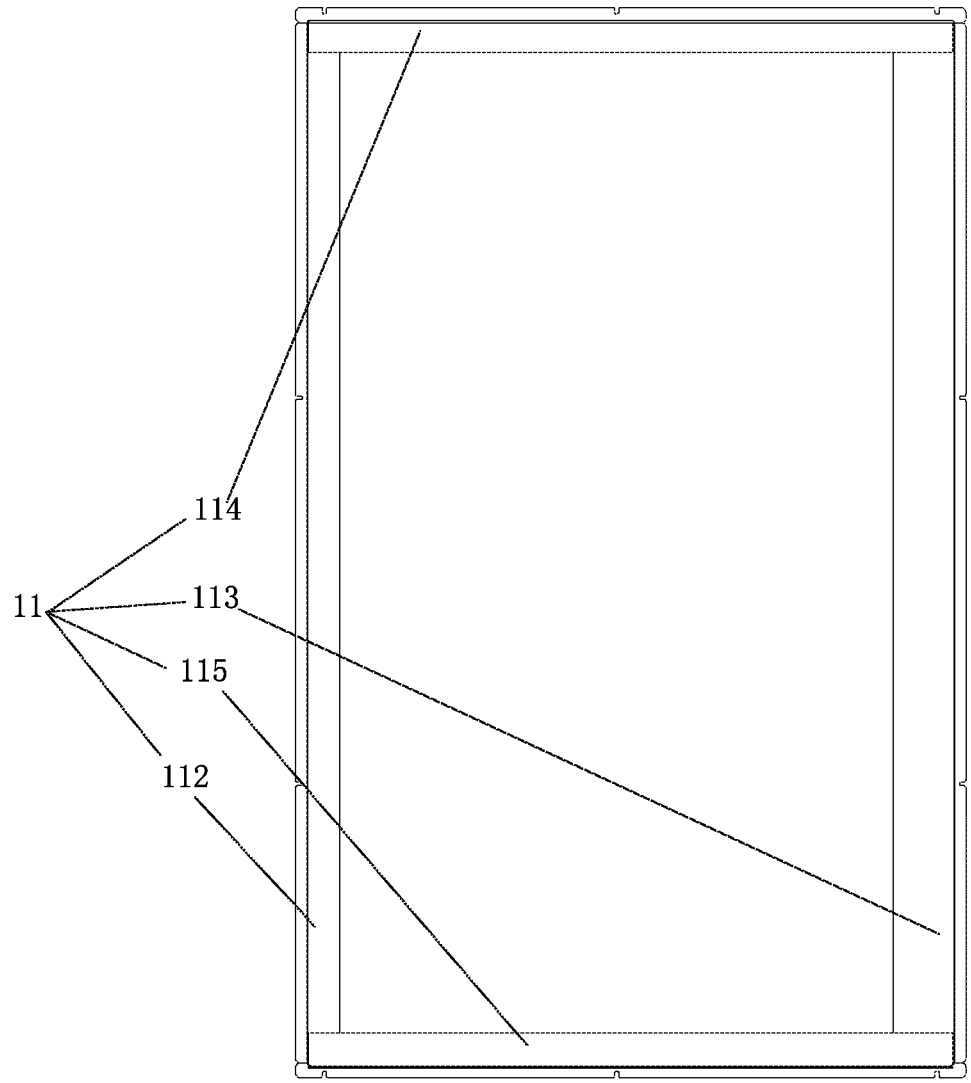
FIG. 8 is a schematic cross-sectional structural diagram of a packaging frame of a transparent display module according to at least an embodiment of the present disclosure.
Figure 9:
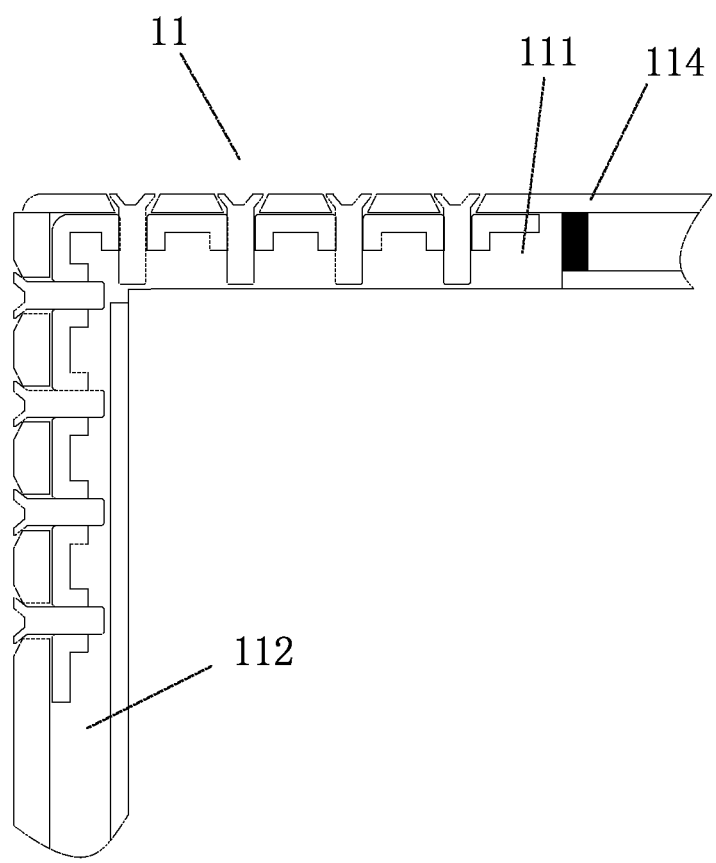
FIG. 9 is a schematic cross-sectional structural view of a packaging frame of a transparent display module according to at least an embodiment of the present disclosure taken at a first viewing angle.

As shown in FIG. 8 and FIG. 9, in a specific implementation, the transparent display module may be of a rectangular shape, and the packaging frame 11 may include a first side frame 112, a second side frame 113, a third side frame 114 and a fourth side frame 115, The first side frame 112 and the second side frame 113 are arranged on opposite sides of the transparent display screen, the light emitting component is arranged on the first side frame 112 and the second side frame 113, and the third side frame 114 and the fourth side frame 115 are arranged on the other opposite sides of the transparent display screen. The locking clearance cavity 111 of the third side frame 114 is in communication with the locking clearance cavities 111 of the first side frame 112 and the second side frame 113, and the locking clearance cavity 111 of the fourth side frame 115 is in communication with the locking clearance cavities 111 of the first side frame 112 and the second side frame 113. The locking clearance cavity 111 of the third side frame 114 is blocked at a preset distance from the first side frame 112 and at a preset distance from the second side frame 113. The locking clearance cavity of the fourth side frame 115 is blocked at a preset distance from the first side frame and at a preset distance from the second side frame.

As shown in FIG. 1 to FIG. 9, the locking clearance cavity 111 is an exemplary structure of the packaging frame 11, which may increase the overall strength of the packaging frame 11 of a strip-shaped catching groove structure. The locking clearance cavity 111 is arranged at the back of the catching groove. After the packaging frame 11 packages the transparent display screen 2, the locking clearance cavity 111 is opposite to the side end of the transparent display screen 2. The first side frame 112, the second side frame 113, the third side frame 114, and the fourth side frame 115 are of the same structure but different lengths. Therefore, the locking clearance cavities 111 of the first side frame 112, the second side frame 113, the third side frame 114, and the fourth side frame 115 that surround the transparent display screen 2 are sequentially connected. Therefore, when the light emitting component 4 is arranged on the first side frame 112 and the second side frame 113, the light emitting component 4 may not only serve as a light source of the transparent display screen 2, but also generate certain heat while emitting light, which may heat air, and the heated air may flow into the locking clearance cavities 111 of the third side frame 114 and the fourth side frame 115 along the locking clearance cavities 111 of the first side frame 112 and the second side frame 113. Since the position where the third side frame 114 is connected with the first side frame 112 and the second side frame 113 is a position where a gap is easily generated between the packaging structure 1 and the transparent display screen 2, that is, air with water vapor easily enters between the packaging structure 1 and the transparent display screen 2 from this position, the locking clearance cavity 11 of the third side frame 114 is blocked at a predetermined distance from the first side frame 112 and the second side frame 113. The predetermined distance is such that the locking screw connecting the two frames is avoided, and the locking screw may be contained in the blocked space. The hot air stays near the position where the third side frame 114 is connected with the first side frame 112 and the second side frame 113 after plugging, and thus the air entering between the packaging structure 1 and the transparent display screen 2 may be heated, and the condensation phenomenon between the packaging structure 1 and the transparent display screen 2 may be further avoided. Similarly, the blocking of the above-mentioned third side frame is also suitable for the fourth side frame and will not be repeated here.

In some embodiments, at least an embodiment of the present disclosure further provides an electrical equipment including any of the display modules described above, and thus the condensation phenomenon may by eliminated. The display module may be, for example, the transparent display module described above. The transparent display module comprises a transparent display screen 2, a packing frame 11, and a heating layer. The transparent display screen 2 is packaged by a packaging structure 1. The packaging structure 1 comprises a packaging frame 11 wrapping the entire circumference of the end of the transparent display screen 2, and the packaging frame 11 is provided with a light emitting component 4 which is used as a light source of the transparent display screen 2. The heating layer 3 is disposed between the sub-packaging frame 11 and the transparent display screen 2, and connected to the electrical connection terminal of the light emitting component 4.

Specifically, the transparent display module according to the embodiment of the present disclosure may be the transparent display module provided in any of the above embodiments, and the specific implementation structure may refer to the relevant contents described in the above embodiments, which will not be described here. The transparent display module may be arranged on the surface of the casing of the electrical equipment and used as a display window of the electrical equipment for displaying items inside the electrical equipment that require to be displayed, wherein the electrical equipment may be an instant juice retailer and an automatic vending machine.

In the embodiment of the disclosure, the transparent display module arranged on the electrical equipment is additionally provided with a heating layer, the heating layer is connected with the electrical connection terminal of the light emitting component, the light emitting component may be electrified and heated at the same time when the light emitting component is electrified, and the heating layer is arranged between the packaging frame and the transparent display screen, so that the gas near the heating layer may be heated to a certain temperature, and in particular, the air entering between the transparent display screen and the packaging structure through the gap of the packaging structure may be heated. The technical solutions of the present disclosure may effectively solve the problem that low-temperature air enters between the transparent display screen and the packaging structure which meets the air with a higher temperature causes condensate and thus affects the display effect of the transparent display module, and ensures that when the transparent display module is used as a display device of an electrical equipment requiring refrigeration, the condensation of water vapor does not occur in the transparent display module.

The foregoing is only exemplary embodiments of the present disclosure, but the protection scope of the present disclosure is not limited thereto, and the scope of protection of the present disclosure shall be subject to the protection scope of the claims.

What is claimed is:

1. A display module, comprising:
    a display screen;
    a packaging structure comprising a packaging frame surrounding an edge of the display screen;
    a heating layer between the packaging frame and the display screen; and
    a light emitting component configured to be on the packaging frame and used as a light source of the display screen,
    wherein an electrical connection terminal of the light emitting component is electrically connected to the heating layer through a preset electrical connection path, and the heating layer is configured to be electrically connected to a power supply through the electrical connection terminal of the light emitting component to generate heat,
    the packaging structure further comprises:
        a panel, wherein the panel is on opposite surfaces of the display screen, and the packaging frame surrounds an edge of a display body formed by the panel and the display screen,
        a first buffer sealing layer between the display screen and the panel, and
        a second buffer sealing layer between the panel and the packaging frame, the second buffer sealing layer surrounding the edge of the display body,
    wherein the heating layer is a strip-shaped sheet, and
    the heating layer is between the second buffer sealing layer and the packaging frame and surrounds the second buffer sealing layer on a side of the display body;
    the heating layer is between the second buffer sealing layer and the display body and surrounds a side of the display body;
    the heating layer is attached with the first buffer sealing layer and is between the first buffer sealing layer and the display screen; or
    the heating layer is attached with the first buffer sealing layer and is between the first buffer sealing layer and the panel.

2. The display module according to claim 1, wherein
    the heating layer is a metal mesh layer; or
    the heating layer is a metal sheet layer.

3. The display module according to claim 1, wherein
    the packaging frame comprises a first side frame, a second side frame, a third side frame and a fourth side frame, the first side frame and the second side frame are on two opposite sides of the display screen, the light emitting component is on at least one of the first side frame and the second side frame, and the third side frame and the fourth side frame are on another two opposite sides of the display screen,
a locking clearance cavity of the third side frame is in communication with locking clearance cavities of the first side frame and the second side frame, and a locking clearance cavity of the fourth side frame is in communication with the locking clearance cavities of the first side frame and the second side frame, and
the locking clearance cavity of the third side frame is blocked at a preset distance from the first side frame and at a preset distance from the second side frame, and the locking clearance cavity of the fourth side frame is blocked at a preset distance from the first side frame and at a preset distance from the second side frame.

4. The display module according to claim 1, wherein the display screen is at least partially transparent.

5. The display module according to claim 1, wherein the packaging frame entirely surrounds the edge of the display screen.

6. The display module according to claim 1, wherein the panel is at least partially transparent.

7. The display module according to claim 1, wherein the packaging frame and the second buffer sealing layer both entirely surround the edge of the display body.

8. The display module according to claim 1, wherein the first buffer sealing layer entirely surrounds the edge of the display screen on a surface of the display screen facing the panel.

9. The display module as claimed in claim 1, wherein a cross section of the second buffer sealing layer is of a "⊏" shape.

10. An electrical equipment comprising:
the display module according to claim 1.

11. The electrical equipment according to claim 10, wherein
the heating layer is at a corner of the packaging frame; or
the heating layer is arranged along an entire circumference of the packaging frame.

12. The display module according to claim 1, wherein
the heating layer is at a corner of the packaging frame; or
the heating layer is arranged along an entire circumference of the packaging frame.

* * * * *